(12) United States Patent
Rosocha et al.

(10) Patent No.: US 7,521,026 B2
(45) Date of Patent: Apr. 21, 2009

(54) FIELD-ENHANCED ELECTRODES FOR ADDITIVE-INJECTION NON-THERMAL PLASMA (NTP) PROCESSOR

(75) Inventors: Louis A. Rosocha, Los Alamos, NM (US); Vincent Ferreri, Westminster, CO (US); Yongho Kim, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 886 days.

(21) Appl. No.: 11/017,392

(22) Filed: Dec. 20, 2004

(65) Prior Publication Data

US 2005/0133927 A1 Jun. 23, 2005

Related U.S. Application Data

(63) Continuation-in-part of application No. 10/395,046, filed on Mar. 21, 2003, now Pat. No. 7,063,819.

(51) Int. Cl.
*B01J 19/08* (2006.01)

(52) U.S. Cl. ................................ 422/186.04; 96/52
(58) Field of Classification Search ............ 422/186.04; 96/52
See application file for complete search history.

(56) References Cited

U.S. PATENT DOCUMENTS 5,066,316 A * 11/1991 Ikeda ............................ 96/52
6,365,112 B1 * 4/2002 Babko-Malyi et al. . 422/186.04

* cited by examiner

*Primary Examiner*—Kishor Mayekar
(74) *Attorney, Agent, or Firm*—Mark N. Fitzgerald; Bruce H. Cottrell; Juliet A. Jones

(57) ABSTRACT

The present invention comprises a field enhanced electrode package for use in a non-thermal plasma processor. The field enhanced electrode package includes a high voltage electrode and a field-enhancing electrode with a dielectric material layer disposed in-between the high voltage electrode and the field-enhancing electrode. The field-enhancing electrode features at least one raised section that includes at least one injection hole that allows plasma discharge streamers to occur primarily within an injected additive gas.

6 Claims, 3 Drawing Sheets

FIELD-ENHANCED ELECTRODES FOR ADDITIVE-INJECTION NON-THERMAL PLASMA (NTP) PROCESSOR

RELATED APPLICATIONS

This application is a continuation-in-part of Ser. No. 10/395,046, filed Mar. 21, 2003 now U.S. Pat. No. 7,063,819, issued on Jun. 6, 2006 to Louis A. Rosocha, incorporated herein by reference for all purposes.

STATEMENT REGARDING FEDERAL RIGHTS

This invention was made with government support under Contract No. W-7405ENG-36 awarded by the U.S. Department of Energy. The government has certain rights in the invention.

FIELD OF THE INVENTION

The present invention relates generally to non-thermal plasma processors, and, more particularly, to electrodes used in non-thermal plasma processors.

BACKGROUND OF THE INVENTION

The U.S. Resource Conservation and Recovery Act (RCRA), the National Pollutant Discharge Elimination System (NPDES), and the National Emissions Standards for Hazardous Air Pollution regulations (NESHAP) strictly regulate the emission and discharge of volatile organic compounds (VOCs). Technical and regulatory difficulties associated with current VOC and hazardous air pollutant (HAP) treatment methods such as air-stripping (dilution), activated-carbon absorption, incineration, and thermal-catalytic treatment have prompted the search for alternatives. The drawbacks of present methods result in ineffective treatment, the generation of large secondary waste streams, and increased costs. It is also recognized that, for example, to operate fossil-fueled motor vehicles and other combustion-related engines or machinery under higher efficiency and reduced pollution output conditions in the future, it is desirable to have clean-burning, energy-efficient, hydrocarbon liquid fuels. This invention can also be used to synthesize such fuels from gaseous feedstocks.

The present invention has recognized these prior art drawbacks, and employs electrical discharges/non-thermal plasmas in a gaseous medium to destroy air pollutants or undesirable chemicals/chemical or biological agents; process chemicals, or synthesize chemical compounds. In non-thermal plasmas, the electrons are "hot", while the ions and neutral species are "cold" which results in little waste enthalpy being deposited in a process gas stream. This is in contrast to thermal plasmas, where the electron, ion, and neutral-species energies are in thermal equilibrium (or "hot") and considerable waste heat is deposited in the process gas.

The present invention improves formation of active species formed from the injection of additive gases/chemical compounds into a process gas stream to increase the efficiency and/or selectivity of the plasma processing by providing a shaped injection electrode that enhances and/or tailors the electric field near the additive-gas injection holes/ports.

Various objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the purposes of the present invention, as embodied and broadly described herein, the present invention includes a field enhanced electrode package for use in a non-thermal plasma processor. The field enhanced electrode package includes a high voltage electrode and a field-enhancing electrode with a dielectric material layer disposed in-between the high voltage electrode and the field-enhancing electrode. The field-enhancing electrode features at least one raised section that includes at least one injection hole that allows plasma discharge streamers to occur primarily within an injected additive gas.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

The subject technology uses a silent-discharge/dielectric-barrier non-thermal plasma (NTP) processor to generate highly reactive chemical species (such as free radicals). These reactive species (0-atoms, OH-radicals, N-radicals, excited $N_2$ and $O_2$ molecules, $HO_2$-radicals, NH-radicals, CH-radicals, etc.) readily decompose organic chemicals (e.g., VOCs), oxides of sulfur and nitrogen ($SO_2$ and $NO_x$), and odor agents (e.g., aldehydes, $H_2S$, and many others), breaking their chemical bonds and producing non-hazardous or easily managed products. These radicals can also play a key role in chemical synthesis, producing desirable products (e.g., creating higher-order hydrocarbon fuels from methane/natural gas).

Figure 1:
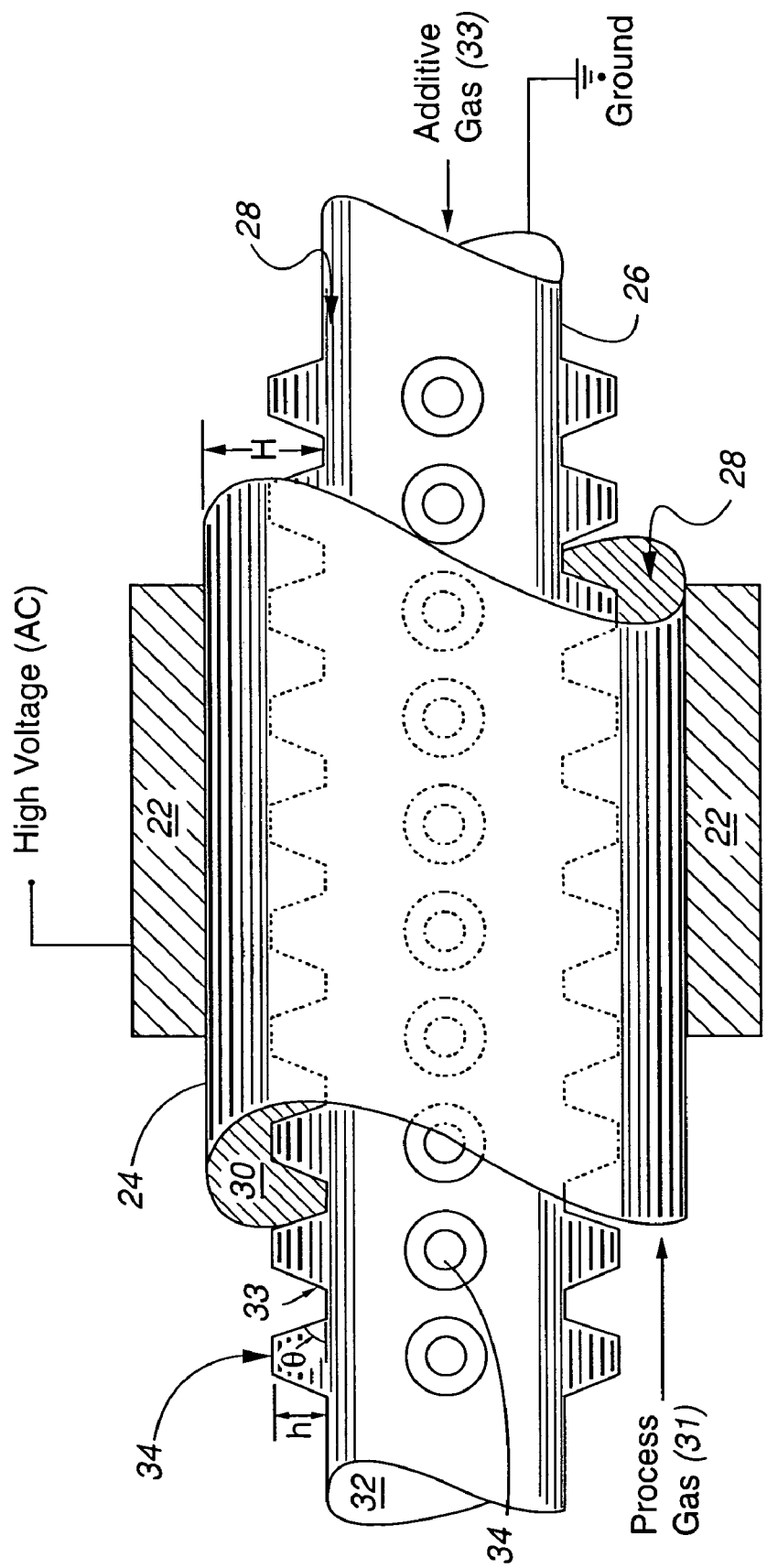
FIG. 1 pictorially shows one embodiment of a shape for the present invention showing a coaxial-cylinder configuration of the additive-gas injection, field-enhanced electrode concept, using a silent discharge plasma (dielectric-barrier discharge) non-thermal plasma reactor.

Several types of electric discharge configurations can create non-thermal plasmas. Referring now to FIG. 1, in the present invention the processor makes use of a dielectric-barrier discharge arrangement. Here, two conducting electrodes, high voltage electrode 24 and field enhancing electrode 26, one or both of which are covered by dielectric material layer 28, are in proximity to one another, separated by gas modification passage 30, where the discharge gap is defined by dimension H ranging from 1-10 mm. High-voltage source 22 (alternating current, frequency in a typical range of 10 Hz-20 kHz) is applied to high voltage electrode 24, creating electrical-discharge streamers in process gas 31 that flows through gas modification passage 30. The discharges are the source of the active non-thermal plasma.

Such an NTP unit is able to reduce the concentration of hazardous compound in off-gases to very low levels by free-radical "cold combustion" or to synthesize desirable chemical products using gaseous feedstocks. Because this invention provides for the injection of additive chemical compounds (e.g., ammonia, hydrocarbons, etc.) into the activated process gas stream, additional reactive species are created.

The improvement provided by the present invention resides in the shape of field enhancing electrode 26 to include raised sections 33 surrounding additive-gas injection holes 34 that reduce the distance between high voltage electrode 24 and field enhancing electrode 26, and, thus reduce discharge gap H by distance h (where h<H). Raised sections 33 enhance the electric field, by factors ranging from 2 to 100, in close proximity to injection holes 34 by virtue of the geometrical configuration (e.g sharpness), allowing plasma/active-species formation in additive gas 37. This results in more plasma energy being channeled into the creation of active species in additive-gas 37 streams and less non-productive energy being deposited into electrical discharge streamers in process gas 31 stream.

The combination of enhanced electrodes in proximity to the injection gas holes provides for a greater variety and generation efficiency of reactive species. Both of these features result in significant improvements over other types of NTP processors. Thus, SDP/DBD processor 10 can be used to generate highly reactive chemical species, such as free radicals, that break chemical bonds, as described above.

Gases that may be used as process gases 31, include, but are not limited to, stack/flue/exhaust gases containing HAPs: (hazardous air pollutants), volatile organic compounds (VOCs), hydrocarbons, chlorocarbons, chloro-fluorocarbons, fluorocarbons, oxides of nitrogen and sulfur, hydrogen sulfide, various odors (e.g., aldehydes), chemical or biological warfare agents, or airborne pathogens; the defining characteristics of this group being toxicity, hazard, pathogenecity, or odor.

Gases that may be used as additive gases 37, include, but are not limited to, methane, ethane, propane, butane, propene, and other organic hydrocarbons, and ammonia, helium, argon, and nitrogen; the defining characteristics of this group being the ability to form free-radical, excited-state, or ionized active species in a plasma.

Materials that may be used for conducting electrodes 24, 26 include aluminum, copper, brass, stainless steel, inconel, titanium, tungsten, and alloyed metals. The preferred materials for conducting electrodes 24, 26 are stainless steel, or any other corrosion-resistant metal, when acid-gases are processed or produced.

Dielectric materials that may be used as a coating include glass, fused silica (quartz), ceramics, porcelain, diamond, or diamond-like carbon; the preferred materials being fused silica and ceramics because of the favorable dielectric constants, mechanical/chemical durability, and relatively low dielectric power loss.

The SDP/DBD processor high-voltage source 22 is operated in a range of 1 Hz-50 kHz in either continuous, intermittent duty, or pulse trains. If pulse trains are employed, they exhibit pulse durations from 5 nanoseconds to 100's of microseconds, with corresponding pulse repetition frequency ranging from 1 Hz to 50 kHz, more preferably in a range of 50 Hz to 20 kHz.

The voltage supplied to the electrode 24 is dependent on the process gas composition and pressure, and discharge gap H. Typically, this would be 5 to 50 kV peak voltage for near-atmospheric pressure air streams with a few millimeter electrode gap spacing.

Figure 2:
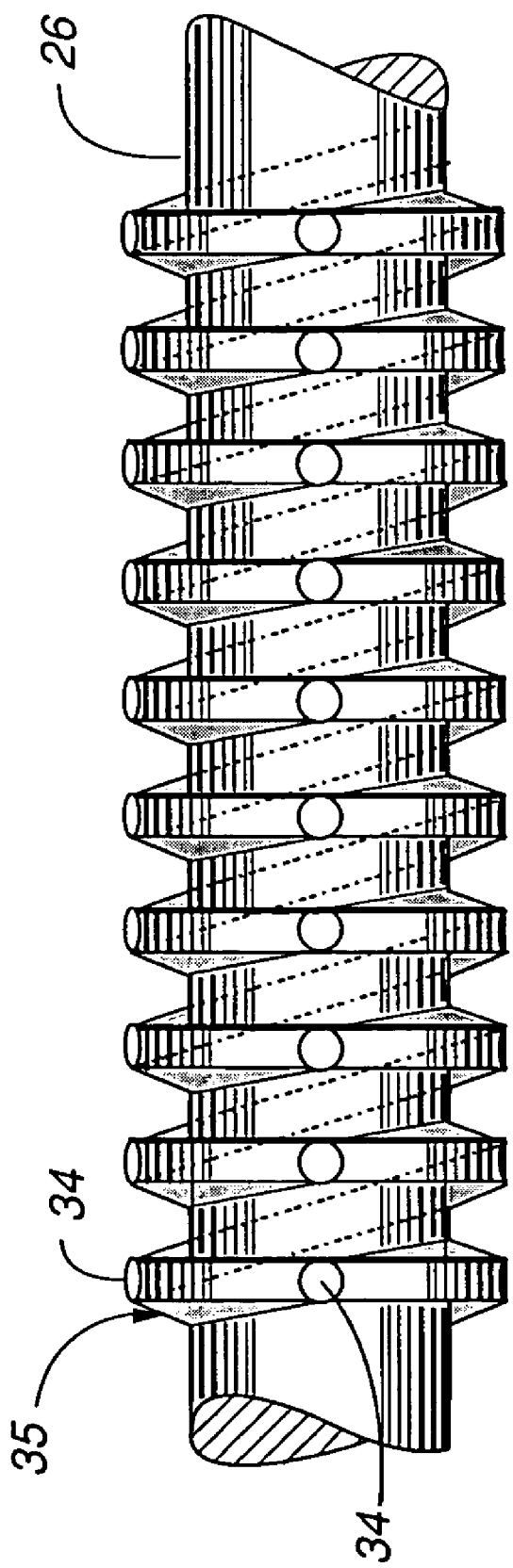
FIG. 2 pictorially shows another embodiment of a shape for the present invention of a field-enhanced injection electrode using a hollow, screw-thread electrode.

Referring again to FIG. 1, raised sections 33 may be formed in any geometrical configuration (conical, square, triangular, hemispherical, etc.), where angle θ is greater than 0 degrees and less than or equal to 90 degrees. The geometric configuration shown here is conical. There are any number of physical configurations that provide the same functionality as in FIG. 1; for example, in FIG. 2, another embodiment of the field-enhancing electrode takes the shape of a hollow threaded screw, where raised sections 33 are in the form of threads with injection holes 34 placed at the top of the thread.

Figure 3:
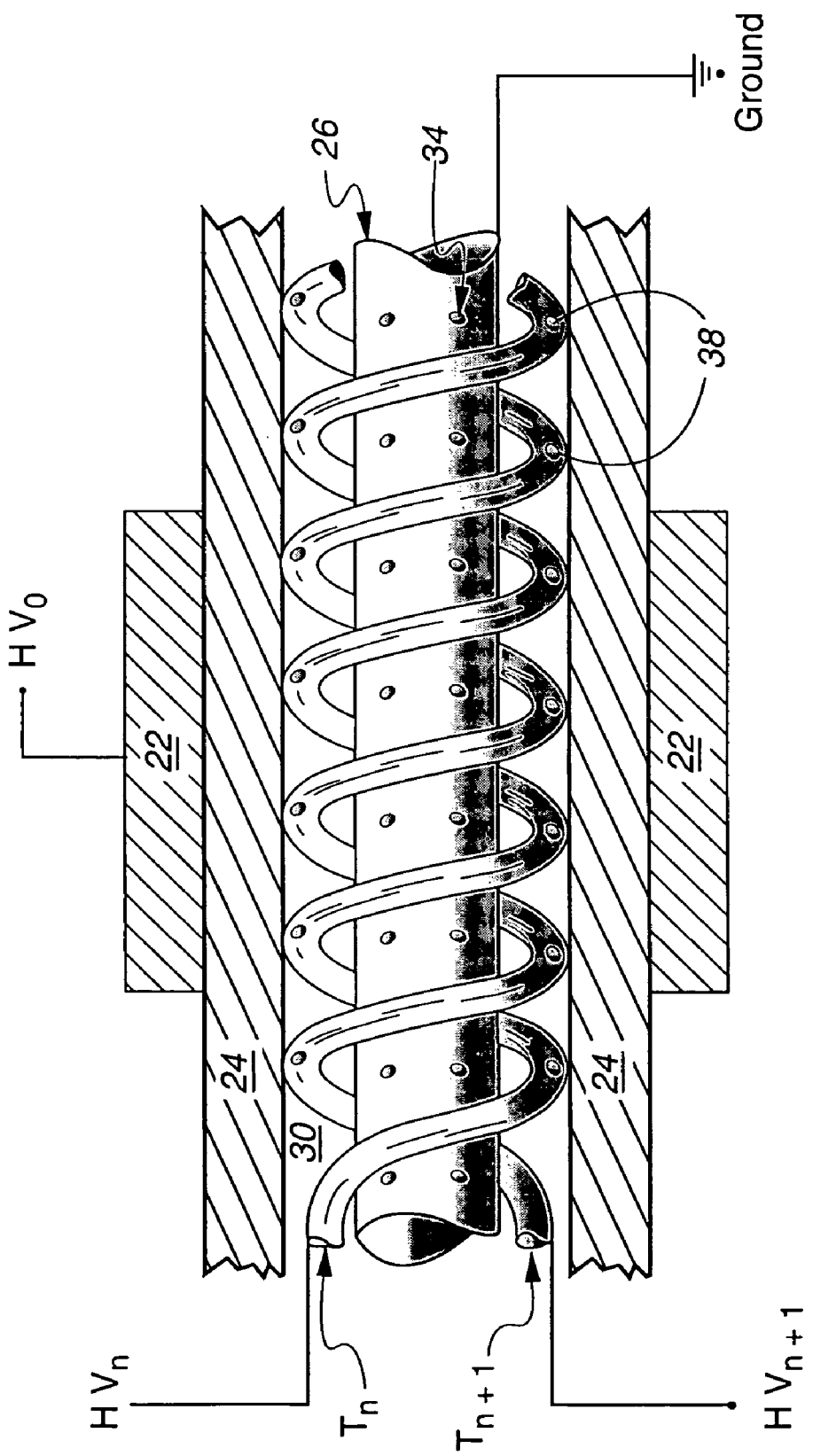
FIG. 3 pictorially shows another embodiment of the present invention including an additional one or more helical hollow tube electrodes.

Referring now to FIG. 3, in another embodiment, one or more tubes $T_n$, $T_{n+1}$, which define injection holes 38, are wrapped in a helix configuration around injection electrode 26, within gas modification passage 30. One or more tubes $T_n$, $T_{n+1}$ are adjacent to, or in intimate contact with, electrode 24. An additive gas flows through one or more tubes $T_n$, $T_{n+1}$, exiting into gas modification passage 30, creating an environment for pre-ionization of gases within passage 30. This configuration allows for an enhanced, uniform, bulk discharge of the NTP during operation.

To further improve the discharge characteristics of the NTP, a number of electrical configurations may be employed. Referring back to FIG. 3, in one embodiment, a separate power supply $HV_n$ energizes pre-ionization electrode $T_n$ to create ions for seeding the main electrical-discharge plasma in gas modification passage 30. This separate power supply can be connected between electrode $T_n$ and field enhancing electrode 26, or between electrode $T_n$ and outer electrode 24. In other embodiments, differing high voltage supplies $HV_{n+1}$ can be connected to additional electrodes $T_{n+1}$, creating any number of differing voltage potentials that provide for continued enhancement of a uniform bulk discharge of the NTP. When additional power supplies are connected in this fashion, electrode $T_n$, $T_{n+1}$ surfaces create discharges that lead to creating additional active species (including UV photons) for processing the gas in passage 30.

Material composition of electrodes $T_n$, $T_{n+1}$ include, but are not limited to: aluminum, copper, brass, stainless steel, inconel, titanium, tungsten, and alloyed metals, and in a preferred embodiment comprise stainless steel or any other corrosion-resistant metal, when acid-gases are processed or produced.

Voltages $HV_n$, $HV_{n+1}$ range from 5 kV to 100 kV, more preferably from 5 kV to 50 kV due to the ease of one skilled in the art to design and construct arc-free plasma chemical reactors and electrical feedthroughs/connectors in this voltage range.

In all the aforementioned embodiments, the addition of a dielectric coating to electrode 26 (the designated ground electrode), electrode 24 (the designated main discharge high-voltage electrode), and/or helical electrodes $T_n$ (embodiment shown in FIG. 3) increases the efficiency of coupling electrical energy into the injected gas by as the dielectric coating allows for proper matching of he power supply impedance to the plasma/electrical discharge impedance. The dielectric layer also prevents the formation of thermal arcs in the process gas and/or the injection gas.

Note that for all the embodiments discussed, rectangular/planar geometries may also be employed, along with corresponding combinations of planar electrodes and tube electrodes.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A field enhanced electrode package for use in a non-thermal plasma processor, comprising:
   a. a high voltage electrode;
   b. a field enhancing electrode that includes at least one raised section defining at least one injection bole for allowing plasma discharge streamers to occur primarily within an additive gas injected through the injection hole; and
   c. a dielectric material layer disposed between said high voltage electrode and said field enhancing electrode;
   where one or more tubes are disposed between said high voltage electrode and said field enhancing electrode, said one or more tubes providing the additive gas that is subjected to an applied electric field to create ions and photons.

2. The field enhanced electrode package of claim 1, where said one or more tubes comprise material selected from the group consisting of stainless steel, aluminum, copper, tungsten, and alloyed metals.

3. The field enhanced electrode package of claim 1, where said one or more tubes is coated with a dielectric material.

4. The field enhanced electrode package of claim 3, where said dielectric material is selected from the group consisting of glass, fused silica (quartz), ceramics, porcelain, diamond, and diamond-like carbon.

5. The field enhanced electrode package of claim 1, where said high voltage electrode and said field enhancing electrode comprise materials selected from the group consisting of aluminum, copper, brass, stainless steel, inconel, titanium, tungsten, and alloyed metals.

6. The field enhanced electrode package of claim 1, where said dielectric material layer comprises a material selected from the group consisting of glass, fused silica (quartz), ceramics, porcelain, diamond, and diamond-like carbon.

* * * * *